(12) United States Patent
Hung et al.

(10) Patent No.: US 11,473,968 B2
(45) Date of Patent: Oct. 18, 2022

(54) ELECTRONIC DEVICES WITH LIGHT SENSOR SYSTEM HAVING POLARIZED LIGHT SOURCE AND LIGHT DETECTOR TO DETECT REFLECTED LIGHT USED TO DETERMINE REFLECTIVITY OF AN OBJECT

(71) Applicant: Apple Inc., Cupertino, CA (US)

(72) Inventors: Po-Chieh Hung, Sunnyvale, CA (US); Nicholas C. Lewty, Singapore (SG)

(73) Assignee: Apple Inc., Cupertino, CA (US)

( * ) Notice: Subject to any disclaimer, the term of this patent is extended or adjusted under 35 U.S.C. 154(b) by 220 days.

(21) Appl. No.: 16/533,078

(22) Filed: Aug. 6, 2019

(65) Prior Publication Data

US 2021/0041288 A1 Feb. 11, 2021

(51) Int. Cl.
*G01J 1/04* (2006.01)
*G01J 1/02* (2006.01)
*H01L 31/167* (2006.01)
*H01L 31/0232* (2014.01)
*G01J 3/02* (2006.01)
*G01J 3/50* (2006.01)
*G01J 3/46* (2006.01)

(52) U.S. Cl.
CPC ........... *G01J 1/0429* (2013.01); *G01J 1/0233* (2013.01); *G01J 3/0224* (2013.01); *G01J 3/0262* (2013.01); *G01J 3/0272* (2013.01); *G01J 3/463* (2013.01); *G01J 3/501* (2013.01); *H01L 31/02327* (2013.01); *H01L 31/167* (2013.01); *G01J 3/0289* (2013.01)

(58) Field of Classification Search
CPC ...... G01J 1/0429; G01J 1/0233; G01J 3/0024; G01J 3/0262; G01J 3/0272; G01J 3/463; G01J 3/501; G01J 3/0289; H01L 31/02327; H01L 31/167
See application file for complete search history.

(56) References Cited

U.S. PATENT DOCUMENTS 6,032,071 A * 2/2000 Binder ................. A61B 5/0059
356/369
6,157,454 A  12/2000 Wagner et al.
(Continued)

FOREIGN PATENT DOCUMENTS

EP        1681541 B1       5/2011
WO      2009067358 A1     5/2009
WO    WO-2011048743 A1 *  4/2011   .......... B41F 33/0036

*Primary Examiner* — Jennifer D Bennett
(74) *Attorney, Agent, or Firm* — Treyz Law Group, P.C.; G. Victor Treyz; Tianyi He

(57) ABSTRACT

An electronic device may include a light sensor system. The light sensor system may have a light source that emits light and a light detector that receives the emitted light after the emitted light has interacted with an external object. The light source may include a ring of light-emitting diodes or other light-emitting devices surrounding the light detector or may have light-emitting devices that are surrounded by a ring-shaped light detector. Polarizer structures may be incorporated into the light sensor system. Control circuitry in the device may control the light source so that different polarizations of light are emitted at different times. The control circuitry may process signals from the light detector that are gathered under different polarizations to discriminate between specular and non-specular reflections from the external object.

23 Claims, 6 Drawing Sheets

(56) References Cited

U.S. PATENT DOCUMENTS

| | | | |
|---|---|---|---|
| 6,674,530 B2 | 1/2004 | Berstis | |
| 7,502,112 B2 | 3/2009 | Kahn et al. | |
| 9,417,131 B2 | 8/2016 | Wong et al. | |
| 2004/0092802 A1* | 5/2004 | Cane | A61B 5/445 600/306 |
| 2006/0178570 A1* | 8/2006 | Robinson | G01N 21/49 600/310 |
| 2009/0304299 A1* | 12/2009 | Motomura | H04N 5/23245 382/254 |
| 2010/0283883 A1* | 11/2010 | Sato | G02B 27/283 348/335 |
| 2011/0232380 A1 | 9/2011 | Deverse et al. | |
| 2012/0250022 A1 | 10/2012 | Zhou et al. | |
| 2013/0276542 A1* | 10/2013 | Herzog | A61B 5/0073 73/655 |
| 2013/0330710 A1 | 12/2013 | Omenetto et al. | |
| 2016/0018318 A1* | 1/2016 | Borges | G01N 21/23 356/369 |
| 2016/0296119 A1* | 10/2016 | Nakamura | G06T 7/0012 |
| 2018/0100731 A1 | 4/2018 | Pau | |
| 2021/0183085 A1* | 6/2021 | Pau | G01B 11/25 |

\* cited by examiner

ELECTRONIC DEVICES WITH LIGHT SENSOR SYSTEM HAVING POLARIZED LIGHT SOURCE AND LIGHT DETECTOR TO DETECT REFLECTED LIGHT USED TO DETERMINE REFLECTIVITY OF AN OBJECT

BACKGROUND

This relates generally to electronic devices and, more particularly, to electronic devices with sensors.

Computer drawing programs often contain color picker tools. A color picker tool can be used to select a desired brush color from a palette of available colors.

It can be challenging to select colors accurately using color pallets, particularly when a user is interested in matching a brush color in a drawing program to the actual color of a real-world object. Ambient lighting conditions may affect the user's perception of the color of the real-world object and display color issues may affect the user's ability to accurately select brush colors from a pallet on a display.

SUMMARY

An electronic device may include a light sensor system. The electronic device may have an elongated housing such as a cylindrical housing that extends along a longitudinal axis. The light sensor system may make measurements on an external object. These measurements may be used in a drawing program or other computer program. For example, light sensor system measurements may be used in drawing and otherwise recreating real-world objects in a computer environment.

A light detector in the light sensor system may be aligned with the longitudinal axis of the elongated housing. The light sensor system may have a light source formed from a ring of light-emitting diodes surrounding the light detector. In some configurations, the light sensor system may have a light source that is aligned with the longitudinal axis surrounded by a ring-shaped light detector.

Polarizer structures may be incorporated into the light sensor system. The polarizer structures may include one or more linear polarizers, circular polarizers, electrically adjustable polarizers such as electrically adjustable rotatable polarizers, and/or other polarizer structures.

Control circuitry in the device may control the polarization of emitted light from the light source. For example, the control circuitry may control the light source so that different polarizations of light are emitted at different times. The light detector may measure the emitted light of the different polarizations after the emitted light has interacted the external object. The control circuitry may process signals from the light detector that are gathered under different polarizations to discriminate between specular and non-specular reflections from the external object.

DETAILED DESCRIPTION

Figure 1:
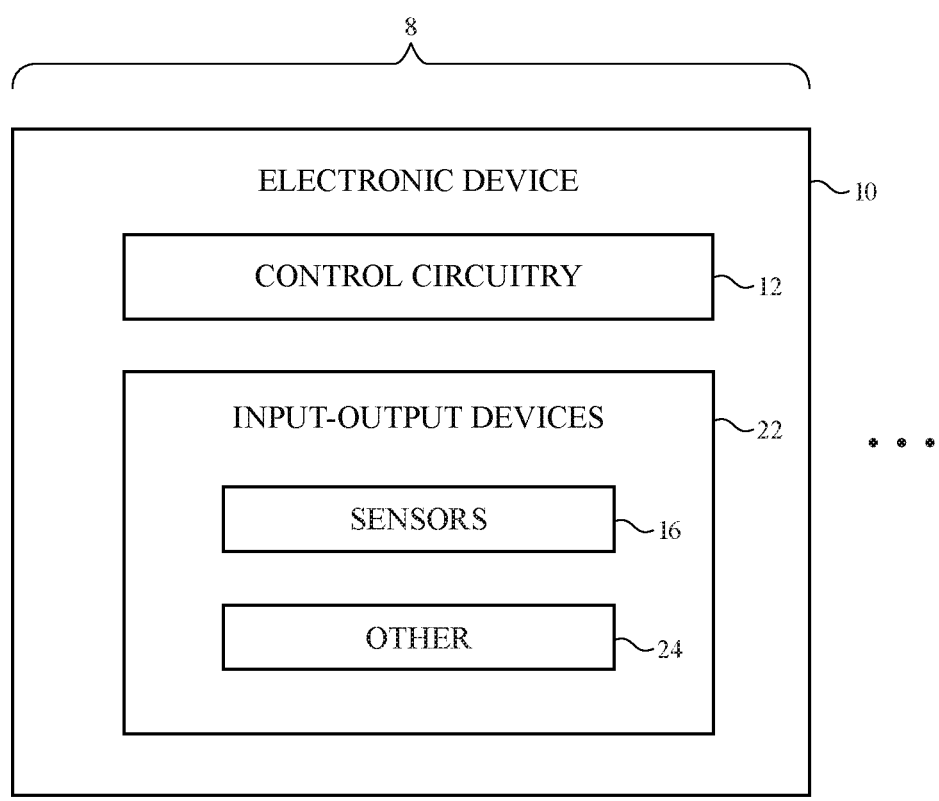
FIG. 1 is a schematic diagram of an illustrative electronic device in accordance with an embodiment.

An electronic device such as a stylus may be provided with a light sensor. The stylus, which may sometimes be referred to as a electronic pencil or pen, may be held in a user's fingers in a position suitable for drawing and otherwise manipulating the tip of the stylus. The stylus may be a computer stylus for use with a touch sensitive display in a tablet computer or other display or may be a stylus that is used with other equipment. During operation, the stylus may be in wireless communication with other electronic devices (e.g., a tablet computer), so that colors that are measured with the light sensor of the stylus may be incorporated into a computer program. In some configurations, the light sensor may be provided in a stylus that is not used with a tablet computer (e.g., a real-life color picker stylus) or may be incorporated into other equipment.

The light sensor in the electronic device, which may sometimes be referred to as a light sensor system, may be a color light sensor. A light source in the color light sensor may be used to supply light to the surface of a real-world object. A light detector may measure the supplied light after the light has interacted with the surface of the real-world object (e.g., after the light has specularly or non-specularly reflected from the real world object or has been transmitted through the object). In this way, the color of the real-world object may be measured by the color sensor.

Specular light reflections from an object arise when the surface of the object has a smooth or glossy surface finish (e.g., objects with glassy or metal surfaces or other shiny surfaces). Non-specular light reflections from an object arise when the object has a matte finish and scatters light diffusely. By providing the electronic device with polarizer structures, the light sensor system (light sensor) of the electronic device can discriminate between specular light reflections and non-specular light reflections. This information can then be used in a two-dimensional or three-dimensional drawing program, may be used in software that creates virtual reality worlds, or may be used in other software. For example, measurements with the electronic device may reveal which portions of an object have particular colors and amounts of shininess and this information may be used by software code in a computer or other electronic device to recreate the particular colors and amounts of shininess for a user.

Light sensor structures may be mounted near the tip of a stylus or other elongated portable electronic device, thereby allowing a user to sample an object's appearance by placing the tip of the device against the surface of the object. This type of arrangement and/or other arrangements may involve gathering information on real-world objects such as the color of a real-world object, the lightness or darkness of a real-world object under given illumination, and the presence and absence of specular surfaces on a real-world object. In this way, the appearance of real-world objects can be measured and imported into virtual reality systems, drawing programs, or other software.

FIG. 1 is a schematic diagram of an illustrative electronic device with a light sensor. As shown in FIG. 1, system 8 may include one or more electronic devices such as electronic device 10. The electronic devices of system 8 may include computers, cellular telephones, head-mounted devices, wristwatch devices, accessories such as stylus devices (sometimes referred to as electronic pencils), and other electronic devices.

As shown in FIG. 1, electronic devices such as electronic device 10 may have control circuitry 12. Control circuitry 12 may include storage and processing circuitry for controlling the operation of device 10. Circuitry 12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 12 may be based on one or more microprocessors, microcontrollers, digital signal processors, baseband processors, power management units, audio chips, graphics processing units, application specific integrated circuits, and other integrated circuits. Software code may be stored on storage in circuitry 12 and run on processing circuitry in circuitry 12 to implement control operations for device 10 (e.g., data gathering operations, operations involving the adjustment of the components of device 10 using control signals, etc.). Control circuitry 12 may include wired and wireless communications circuitry. For example, control circuitry 12 may include radio-frequency transceiver circuitry such as cellular telephone transceiver circuitry, wireless local area network (WiFi®) transceiver circuitry, Bluetooth® circuitry, millimeter wave transceiver circuitry, and/or other wireless communications circuitry.

In scenarios in which system 8 includes multiple electronic devices, the communications circuitry of the electronic devices (e.g., the communications circuitry of control circuitry 12 of device 10), may be used to support communication between the electronic devices. For example, one electronic device may transmit video, audio, sensor data, and/or other data to another electronic device in system 8. Electronic devices in system 8 may use wired and/or wireless communications circuitry to communicate through one or more communications networks (e.g., the internet, local area networks, etc.). The communications circuitry may be used to allow data to be received by device 10 from external equipment (e.g., a tethered computer, a portable device such as a handheld device or laptop computer, online computing equipment such as a remote server or other remote computing equipment, or other electrical equipment) and/or to provide data to external equipment (e.g., a tethered computer, a portable device such as a handheld device or laptop computer, online computing equipment such as a remote server or other remote computing equipment, or other electrical equipment). Arrangements in which system 8 includes a single device 10 may also be used.

Device 10 may include input-output devices 22. Input-output devices 22 may be used to allow a user to provide device 10 with user input. Input-output devices 22 may also be used to gather information on the environment in which device 10 is operating. Output components in devices 22 may allow device 10 to provide a user with output and may be used to communicate with external electrical equipment.

Some devices 10 in system 8 (e.g., a tablet computer) may include one or more displays. For example, input-output devices 22 may include light-emitting diode displays (e.g., organic light-emitting display panels or display devices based on pixel arrays formed from crystalline semiconductor light-emitting diode dies), liquid crystal displays, and/or other displays.

Input-output circuitry 22 may include sensors 16. Sensors 16 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional lidar (light detection and ranging) sensors, three-dimensional radio-frequency sensors, or other sensors that gather three-dimensional image data), cameras (e.g., infrared and/or visible cameras with respective infrared and/or visible digital image sensors and/or ultraviolet light cameras), gaze tracking sensors (e.g., a gaze tracking system based on an image sensor and, if desired, a light source that emits one or more beams of light that are tracked using the image sensor after reflecting from a user's eyes), touch sensors, buttons, capacitive proximity sensors, light-based (optical) proximity sensors, other proximity sensors, force sensors, sensors such as contact sensors based on switches, gas sensors, pressure sensors, moisture sensors, magnetic sensors, audio sensors (microphones), ambient light sensors, optical sensors for making spectral measurements and other measurements on target objects (e.g., by emitting light and measuring reflected light), microphones for gathering voice commands and other audio input, distance sensors, sensors that are configured to gather information on motion, position, and/or orientation (e.g., accelerometers, gyroscopes, compasses, and/or inertial measurement units that include all of these sensors or a subset of one or two of these sensors), and/or other sensors.

User input and other information may be gathered using sensors and other input devices in input-output devices 22. If desired, input-output devices 22 may include other devices 24 such as haptic output devices (e.g., vibrating components), light-emitting diodes and other light sources (e.g., status indicator lights formed from one or more light-emitting components), speakers such as ear speakers for producing audio output, adjustable optical components (e.g., adjustable polarizers, adjustable lenses, etc.) and other electrical components. Device 10 may include circuits for receiving wireless power, circuits for transmitting power wirelessly to other devices, batteries and other energy storage devices (e.g., capacitors), joysticks, buttons, and/or other components.

Figure 2:
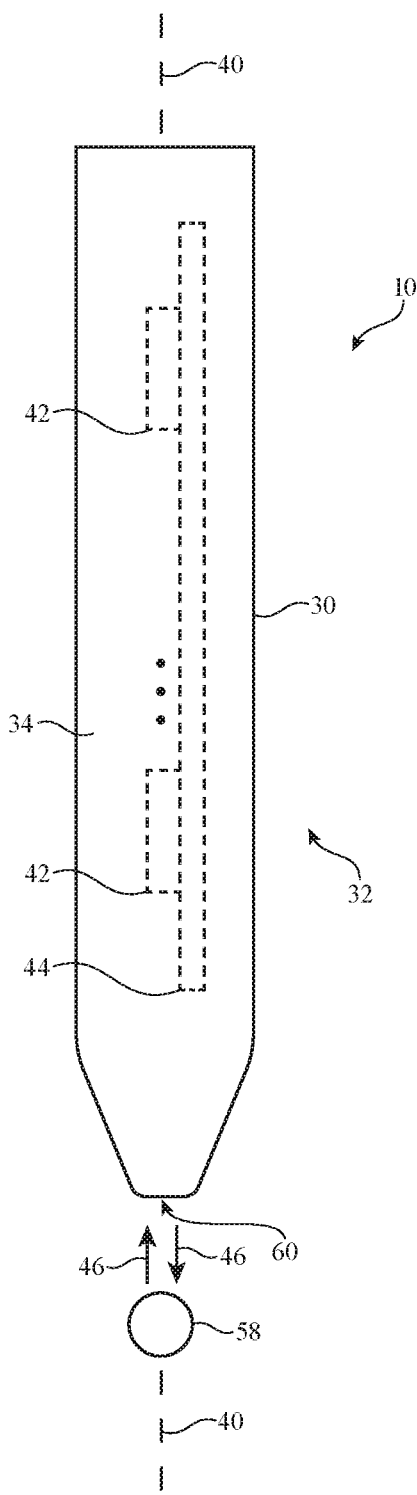
FIG. 2 is cross-sectional view of an illustrative electronic device such as a stylus in accordance with an embodiment.

FIG. 2 is a cross-sectional side view of an illustrative electronic device. As shown in FIG. 2, electronic device 10 may have a housing such as housing 30. Housing 30 may have housing walls that separate an external region such as exterior 32 (e.g., the external environment surrounding device 10) from an internal device region such as interior 34. Housing 30 may include housing walls and other structures formed from polymer, glass, crystalline material such as sapphire, metal, fiber composite materials such as carbon fiber materials and fiberglass, ceramic, natural materials such as wood, fabric, other materials, and/or combinations of these materials.

Housing 30 may have any suitable shape. For example, in a cellular telephone or tablet computer, housing 30 may have a box shape with opposing front and rear sides. In a laptop computer, housing 30 may have upper and lower portions that are joined by a hinge. In the illustrative configuration of FIG. 2, housing 30 has an elongated shape that extends along longitudinal axis 40. This type of shape for device 10 may be used in scenarios in which device 10 is a computer stylus or other device configured to be held in a user's fingers (sometimes referred to as an electronic pencil or electronic pen, color picker stylus, etc.). Other shapes may be used for housing 30, if desired.

Housing 30 may have openings and/or other portions that serve as transparent windows to allow light to pass to exterior 32 from interior 34 and to pass to interior 34 from exterior 32. For example, tip portion 60 of housing 30 may have one or more openings and/or transparent structures such as clear glass, sapphire, clear polymer, or structures formed from other transparent material. Portion 60 may allow light 46 to be emitted from interior 34 to exterior 32 and may allow light 46 in exterior 32 to be received in interior 34.

Electrical components 42 in interior 34 may be mounted to one or more printed circuits such as printed circuit 44. Components 42 may include integrated circuits, discrete components such as inductors, resistors, and capacitors, sensors 16 and other input-output devices 22 of FIG. 1, circuitry such as control circuitry 12 of FIG. 1, batteries, and/or other devices. In an illustrative arrangement, components 42 include optical components. The optical components in device 10 may be overlapped by openings in housing 30 and/or transparent portions of housing 30 that form windows. For example, the optical components may be overlapped by an opening and/or a transparent member in tip portion 60.

The optical components of device 10 may include one or more light sources that emit light 46. The emitted light may illuminate objects in exterior 32 such as objects 58. Emitted light 46 that illuminates object 58 and that reflects from objects 58 or that otherwise reaches device 10 after interacting with object 58 may be detected by one or more light detectors in interior 34.

During optical sensor measurements, information on the reflectivity of object 58 may be gathered at one or more wavelengths. For example, a color light sensor (light sensor system) in device 10 may include a light source that emits light 46 and a corresponding detector that detects the emitted light after the emitted light has specularly or non-specularly reflected from object 58 or has otherwise interacted with object 58 (e.g., by passing through some of object 58, etc.).

The light source of the color sensor may include one or more light-emitting devices. These devices may be light-emitting diodes, lasers (e.g., vertical cavity surface emitting lasers or other diode layers), fixed and/or tunable-wavelength light-emitting devices such as tunable light-emitting diodes and/or tunable lasers, or other components that emit light of one or more colors (e.g., white light, red, green, and blue light, etc.). The light detector of the color sensor may include one or more photodetectors. As an example, the light detector may have a semiconductor substrate (e.g., a silicon die) with multiple photodetectors each of which is covered by a color filter that passes a different respective color of light (e.g., a different band of wavelengths). The light detector may have, for example, 3-10, at least 5, at least 10, fewer than 25, fewer than 15, fewer than 10, or other suitable number of photodetectors each with a different wavelength sensitivity. During operation, the light source may emit white light while the photodetectors of the light detector make light detector measurements. By analyzing these measurement, the color light sensor can determine the relative contribution of each color channel (e.g., each photodetector overlapped by a respective color filter) and can therefore measure the intensity and color (e.g., color coordinates, color temperature, etc.) of the emitted light after the emitted light has interacted with object 58. If desired, color and intensity measurements may be made by using the light source to emit light at one or more colors while one or more photodetectors in the light detector make light detector measurements.

When a user desires to measure the color of an object, the user may place device 10 in range of the object. For example, the user may place the portion of device 10 that contains a color light sensor in direct contact or close proximity to the surface of the object. In configurations in which device 10 contains a light sensor that operates through tip portion 60, the user may, as an example, place tip portion 60 of device 10 in contact with the surface of object 58 or close to object 58. The light source of the color sensor can then emit light that is detected by the light detector of the color sensor to determine the reflectivity (specular and/or non-specular) of object 58 as well as the color of object 58.

To help discriminate between specular and non-specular light reflections as emitted light from the light source is detected by the light detector, the light sensor of device 10 can include polarizer structures (e.g., linear polarizers, circular polarizers, etc.). Polarized light is depolarized when reflected non-specularly (e.g., when this polarized light is scattered diffusely from a matte surface). Polarized light that reflects specularly from shiny surfaces such as metal surfaces or other shiny surfaces tends to retain polarization. These differences in the polarization behavior of the emitted light that is reflected from object 58 can be used to measure the degree to which object 58 is matte or shiny (e.g., to measure whether a surface is fully glossy, partly glossy, or matte, as represented, for example, by a value ranging from 100 for a fully specular reflection characteristic to 0 for a fully matte characteristic). By discriminating between the amount of specular and non-specular reflection to the surface appearance of an object (e.g., by measuring respective specular and non-specular contributions to surface reflectivity), the appearance of the object can be accurately assessed.

Figure 3:
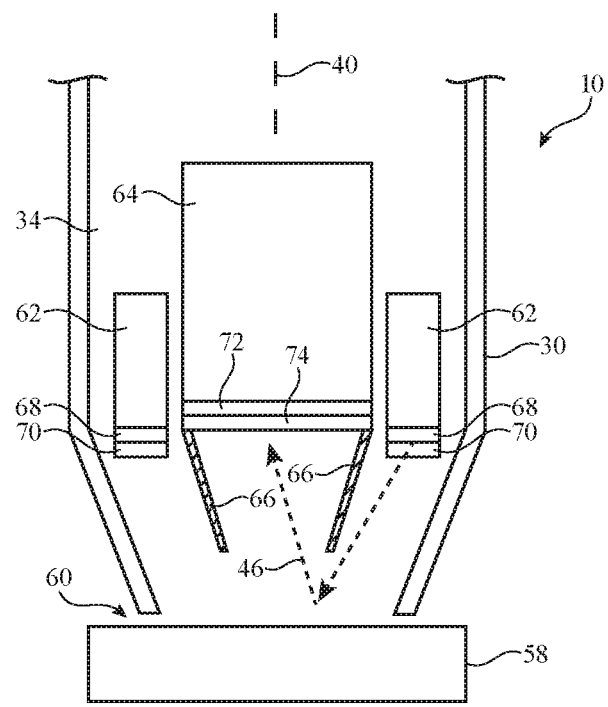
FIG. 3 is a cross-sectional diagram of a tip of an illustrative stylus having polarizer structures in accordance with an embodiment.

FIG. 3 is a side view of device 10 in an illustrative configuration in which the light sensor of device 10 includes polarizer structures to help discriminate between shiny and matte surfaces of object 58 when making color measurement of object 58. As shown in FIG. 3, device 10 may include a housing such as housing 30. Housing 30 may have a cylindrical shape or may have other housing wall shapes that surround interior 34 while extending along longitudinal axis 40. Elongated shapes such as these may help allow a user to hold device 10 in the user's fingers (e.g., so that device 10 serves as a computer stylus and so that one of the ends of device 10 can be used to draw on a tablet computer or other touch sensitive surface and/or so that device 10 can be placed in a desired location for gathering light sensor samples). Other shapes may be used for the housing of device 10, if desired. Configurations in which housing 30 has an elongated computer stylus shape may sometimes be described herein as an example.

Electrical components may be mounted in interior 34. Tip portion 60 of housing 30 is configured to form an opening through which light 46 may pass. Other structures (e.g., optional circuitry that allows device 10 to interact electrically with a touch sensitive display surface in a tablet computer or other device) may also be incorporated into tip portion 60 or the opposing end of device 10, but is not shown in FIG. 3 to avoid over-complicating the drawing.

A light sensor may be mounted in the vicinity of tip portion 60 for gathering monochromatic and/or color information on nearby objects such as object 58. The light sensor of device 10 of FIG. 3 may include a light source that emits light 46 and a light detector that detects emitted light 46 after light 46 has reflected specularly and non-specularly from object 58. The light source may include multiple light-emitting devices 62. Light-emitting devices 62 may include light-emitting diodes and/or lasers of one or more colors. Devices 62 may, as an example, emit white light, may emit multiple colors of light such as red, green, and blue light, may emit different colors of light in N respective color bands (e.g., wavelength bands that slightly overlap). The value of N may be at least 3, at least 5, at least 10, less than 15, less than 9, less than 4, or other suitable number. If desired, light-emitting devices 62 may include one or more tunable light-emitting devices (e.g., one or more devices that emit light at a tunable wavelength or range of wavelengths). Light detector 64 may contain a single photodetector (e.g., a broadband photodetector) or may contain multiple photodetector channels each of which is sensitive to a different color of light (e.g., a different wavelength band). There may be N photodetectors each sensitive to a different color of light, where N is 1, at least 2, at least 4, at least, 7, less than 20, less than 15, less than 8, less than 5, or other suitable number.

In general, any suitable combination of single or multi-color light source and single or multi-color light detector can be used to gather information on the color of object 58. For example, in a light sensor that contains only white light sources, color discrimination operations can be performed by providing the light detector of the light sensor with multiple photodetectors each sensitive to a different color. As another example, in a light sensor that contains light sources of different colors or a tunable laser or light-emitting diode, the color of object 58 may be measured by measuring the relative reflectivity of each of the different emitted colors of light using a monochromatic light detector. Combinations of these arrangements may also be used (in which both differently colored emitters and differently colored photodetectors are used). If desired, the light detector of the light sensor may be a two-dimensional image sensor, allowing surface texture measurements to be captured.

In the illustrative configuration, the light sensor of device 10 includes light source 62 and light detector 64. Light detector 64 may be a multi-channel light detector (a color light detector) formed from multiple photodetectors each of which is sensitive to a different color of light). Light source 62 may have an array of light-emitting devices (e.g., white light light-emitting diodes or other light-emitting devices) that are arranged in a ring around light source 62 to provide even illumination of object 58. Optional interior structures 66 may serve as a light baffle to help ensure that emitted light from light source 62 reflects from the surface of object 58 before being detected by light detector 64.

Polarizers may be included in the light sensor of device 10 to help discriminate between specular and non-specular light reflections. In the example of FIG. 3, each of the light-emitting diodes of light source 62 has a respective linear polarizer 68. This allows each of the light-emitting diodes to emit linearly polarized light. In an alternative embodiment, each of the linear polarizers 68 is covered with a wave plate (see, e.g., optional quarter wave plates 70 of FIG. 3). In this embodiment, each of the light-emitting diodes emits circularly polarized light.

Light detector 64 may have corresponding polarizer structures to help discriminate between specular and non-specular light reflections. As shown in FIG. 3, for example, light detector 64 may be covered by linear polarizer 72. A wave plate such as optional quarter wave plate 74 may be placed on the outer surface of linear polarizer 72. Quarter wave plate 74 may be included in device 10 when quarter wave plates 70 are provided on linear polarizers 68 and may be omitted from device 10 when quarter wave plates 70 are omitted.

Figure 4:
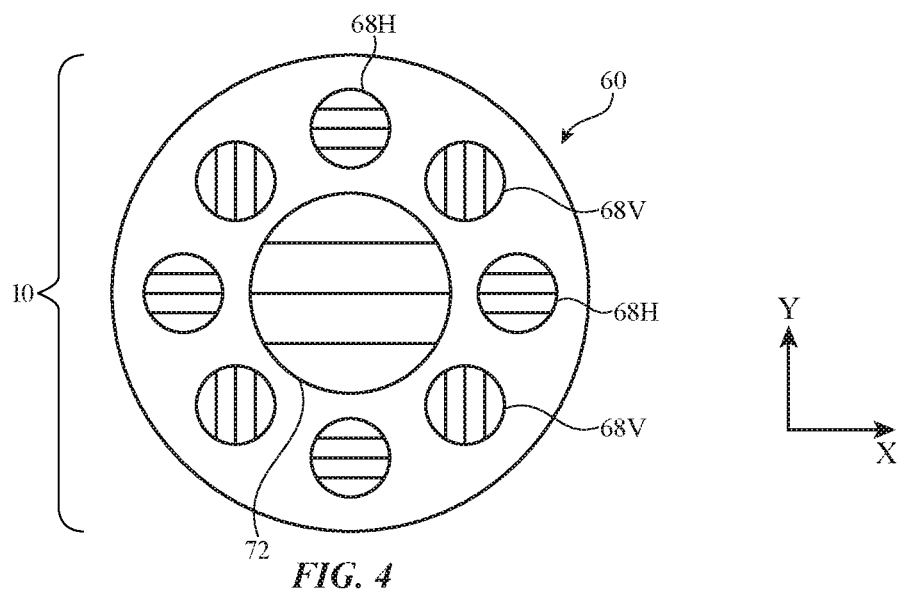
FIG. 4 is an end view of an illustrative light source and sensor polarizer arrangement for a stylus of the type shown in FIG. 3 in accordance with an embodiment.

FIG. 4 is an end view of the tip of device 10 taken along longitudinal axis 40. As shown in FIG. 4, first linear polarizers 68 (linear polarizers 68H) may have their pass axes oriented in a first direction (e.g., along the X axis of FIG. 4) and second linear polarizers 68 (linear polarizers 68V) may have their pass axes oriented in a second direction (e.g., along the Y axis of FIG. 4, orthogonal to the X axis). Linear polarizer 72 of light detector 64 may have a pass axis oriented along the X axis. With this type of arrangement, light source 62 can emit light 46 that is linearly polarized along the X axis (when the light-emitting devices associated with polarizers 68H are used) and/or that is linearly polarized along the Y axis (when the light-emitting devices associated with polarizers 68V are used). Control circuitry 12 can control light source 62 to select which set of light-emitting devices is currently being used to emit light and can thereby control the polarization of emitted light (e.g., to vary the polarization of the emitted light over time).

In the presence of a shiny surface such as a metal surface, the linear polarization of light 46 will tend to be preserved when reflecting from object 58. As a result, when emitted light 46 is linearly polarized along the X axis (which is the same as the pass axis of light detector polarizer 72), the amount of light detected by light detector 64 will be relatively high (nominally no reflected light will be lost), whereas when emitted light 46 is linearly polarized along the Y axis (which is orthogonal to the pass axis of light detector polarizer 72), the linearly polarized light from the light source will be blocked by polarizer 72 and the amount of detected light will be relatively small (nominally all reflected light will be blocked).

In the presence of a matte (diffuse) surface on object 58, emitted light will be depolarized when scattered from the surface of object 58, so both linear polarization states will be reflected equally and no difference will be measured between the first scenario in which emitted light 46 is polarized along the X axis and the second scenario in which emitted light 46 is polarized along the Y axis. The control circuitry of device 10 can therefore measure the degree to which the surface of object 58 is shiny or matte by controlling the polarization of the light emitted by the light source. If the surface is shiny, there will be a relatively large difference in the measured reflected light signal depending on the polarization state of the source, whereas if the surface is matte, there will be a relatively small difference in the measured reflected light signal depending on the polarization state of the source. When intermediate amounts of specular light reflection and non-specular light reflection are present, the response of the light sensor to object 58 will lie between these two extremes and can be measured accordingly.

The behavior of the light sensor in the presence of quarter wave plates 70 and 72 also depends on whether the surface of object 58 is matte or shiny. Quarter wave plates 70 and linear polarizers 68 form circular polarizers for light source 62, whereas quarter wave plate 74 and light detector 64 form a circular polarizer for light detector 64. Quarter wave plates 70 may be oriented so that the light-emitting devices associated with polarizers 68H emit right-hand circularly polarized light and so that the light-emitting devices associated with polarizers 68V emit left-hand circularly polarized light. Quarter wave plate 74 can be oriented so that the circular polarizer formed from wave plate 74 and linear polarizer 72 passes left-hand circularly polarized light and blocks right-hand circularly polarized light. In this type of arrangement, specular reflections will be characterized by relatively large detected signals at detector 64 when one polarization of light is emitted and will be characterized by relatively small detected signals at detector 64 when the opposite polarization of light is emitted. Non-specular reflections will depolarize the emitted light so that the magnitude of detected signals at detector 64 will be relatively unchanged between the two different emitted polarization states.

If desired, the polarization structures in device 10 may include one or more tunable polarizers (e.g., electrically adjustable rotatable polarizers based on liquid crystal devices or other devices). In this type of arrangement, control circuitry 12 can rotate the polarization of the emitted light and/or the polarization sensitivity axis of the light detector. For example, control circuitry 12 can rotate the polarization of the polarizer(s) to help identify minimum and maximum reflected light transmission scenarios to discriminate between specularly reflected and non-specularly reflected light contributions. In scenarios in which device 10 (e.g., longitudinal axis 40) is angled with respect to the surface of object 58, the ability to rotate the polarizer(s) of the light sensor system may help accommodate scenarios in which reflected light has become elliptically polarized (as an example). In situations in which device 10 is used to measure colors on a display screen (e.g., a liquid crystal display or organic light-emitting diode display), the use of a static polarizer is not generally preferred, because such display screens generally emit polarized light. According, when the object to be measured is a self-emitting light source or display with a polarizer, device 10 may include a dynamic polarizer such as a liquid crystal polarizer. An electrically adjustable polarizer such as a liquid crystal polarizer may, if desired, be adjusted to exhibit no polarizing characteristics (e.g., so that the adjustable polarizer is non-polarizing) by controlling the voltage of the polarizer (e.g., the voltage of the liquid crystal polarizer) when the object that is being measured emits light. The type of object present can be detected by initially making measurements under non-polarization and non-light conditions.

Figure 5:
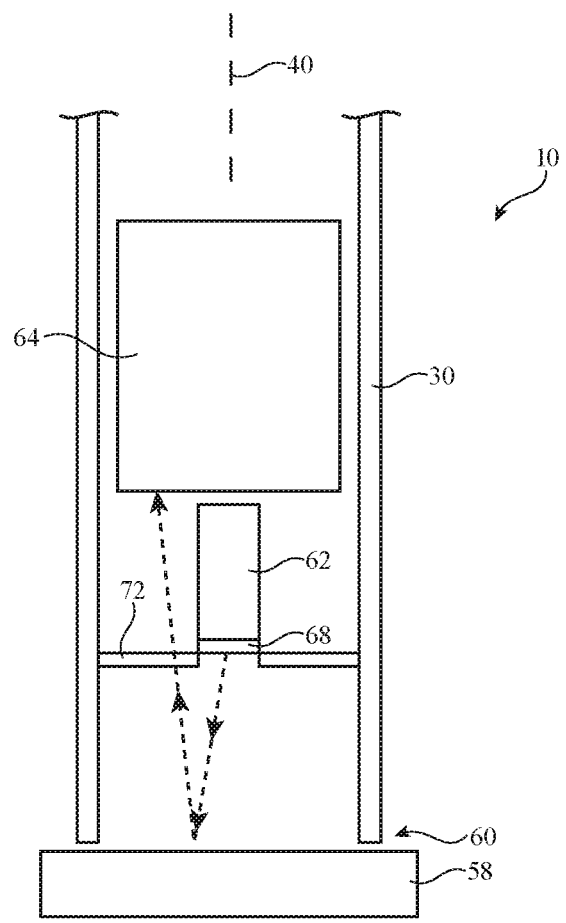
FIG. 5 is a cross-sectional side view of an illustrative stylus having a centrally located light source in accordance with an embodiment.
Figure 6:
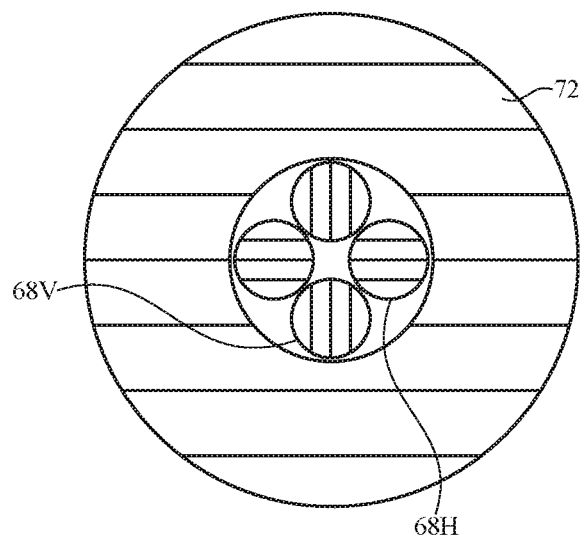
FIG. 6 is an end view of an illustrative light source and sensor polarizer arrangement for a stylus of the type shown in FIG. 5 in accordance with an embodiment.

In the illustrative configuration of FIGS. 3 and 4, light source 62 has light-emitting devices that are arranged in a ring around a centrally located light detector (detector 64). FIG. 5 shows how light source 62 may be centrally located in alignment with longitudinal axis 40 and may emit light that is detected by a ring-shaped light detector 64 that surrounds light source 62. FIG. 6 is an end view of device 10 of FIG. 6 showing how the pass axes of polarizers 68V and 68H may be oriented relative to the pass axis of polarizer 72. Polarizers 68V and 68H may be clustered within a central opening of the ring-shaped linear polarizer 72.

Figure 7:
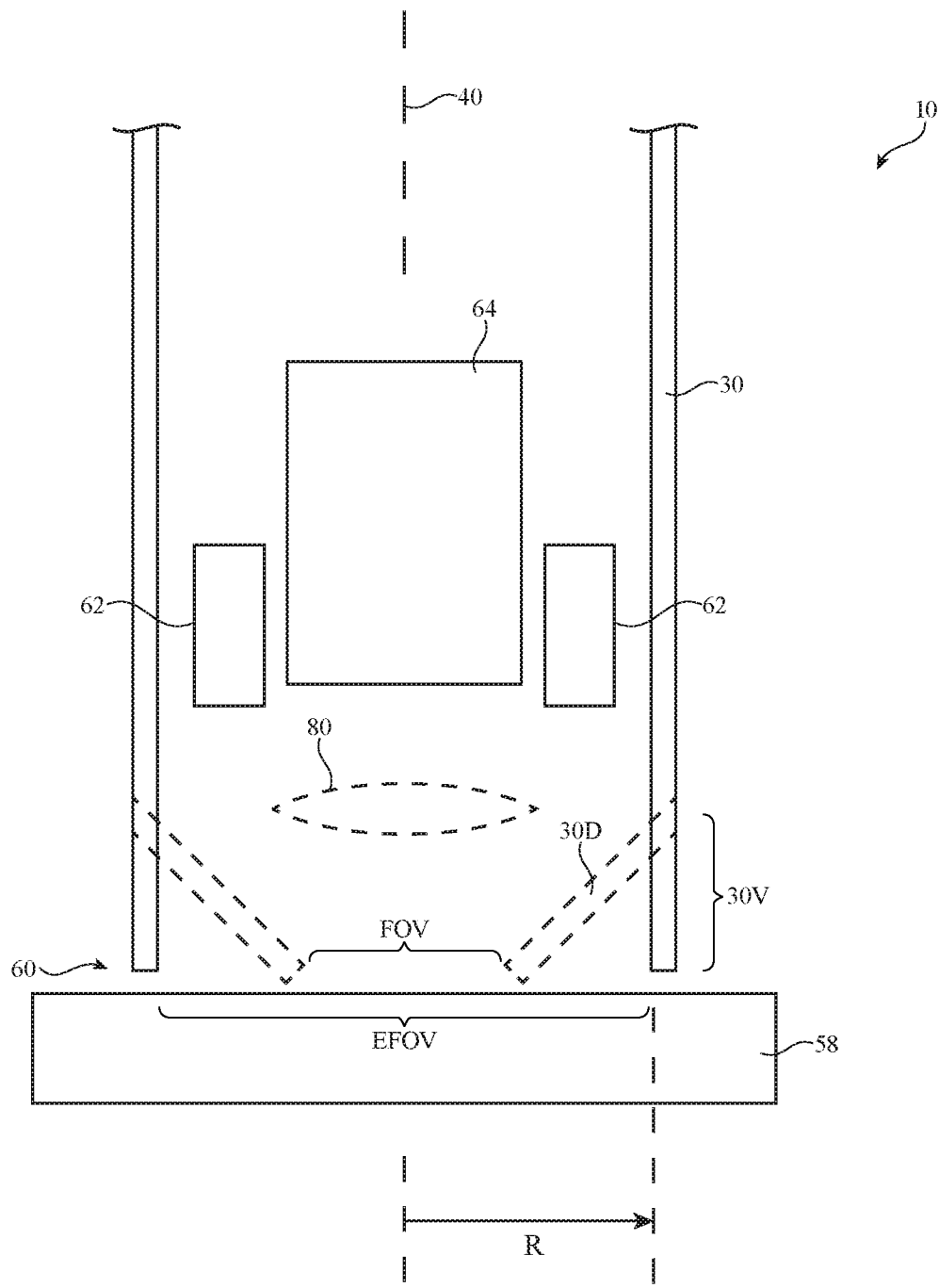
FIG. 7 is a cross-sectional side view of an illustrative elongated device such as a stylus illustrating possible housing sidewall tapering arrangements for the tip of the stylus in accordance with embodiments.

FIG. 7 shows how housing walls 30 may be tapered inwardly at increasing distances towards tip portion 60 of housing 30 (see, e.g., tapered housing wall portions 30D) or may be lightly tapered or untapered (see, e.g., untapered wall portions 30V). Optional optical components 80 (e.g., a lens, diffuser, polarizer, retarder, filter, etc.) may be located in alignment with longitudinal axis 40 and light detector 64. Light source 62 may have an array of light-emitting devices that surround detector 64 in a ring (as an example). During operation, light detector 64 may measure reflected light within field-of-view FOV. In the presence of tapered walls 30D, there is a risk that some of the light emitted by light source 62 (e.g., light that travels in radially outward directions through object 58) will not be within field-of-view FOV and will therefore not be measured by light detector 64. In the presence of lightly tapered walls or untapered walls such as wall portions 30V, however, field-of-view FOV may be widened to cover enlarged field-of-view EFOV, thereby ensuring that more of the emitted light from light source 62 can be detected by light detector 64.

Figure 8:
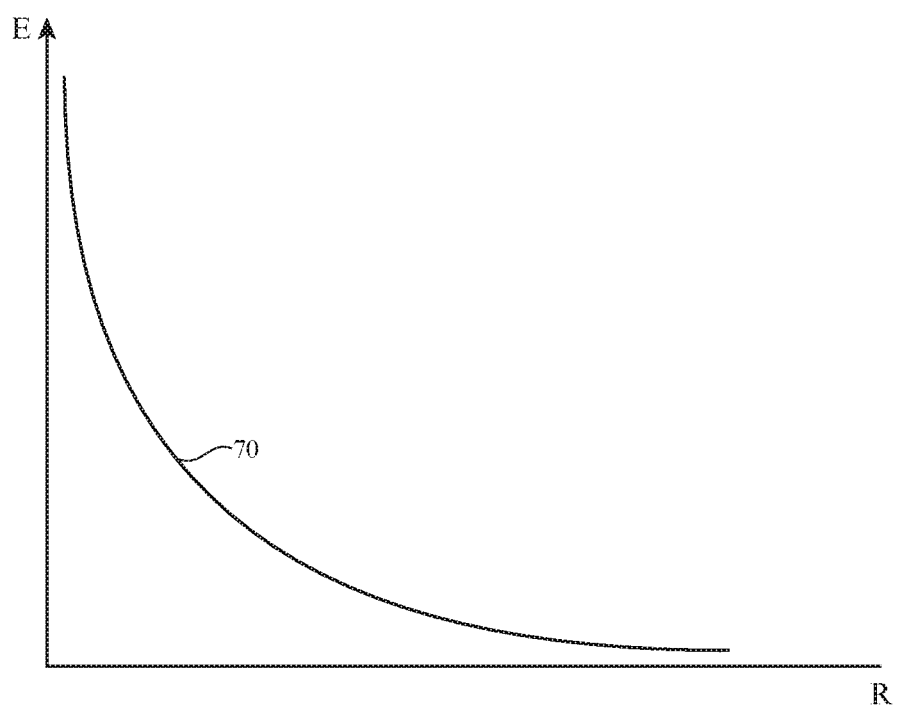
FIG. 8 is a graph showing how color measurement error may be reduced by increasing the radius of the opening of the stylus and thereby reducing taper at the stylus housing tip in accordance with an embodiment.

The amount of taper present in the portion of housing walls 30 at tip portion 60 may be characterized by the radius R of the opening at tip portion 60. FIG. 8 is a graph in which expected measurement error E has been plotted as a function of radius R. As shown by curve 70 of FIG. 8, at very small values of R, less emitted light is reflected and detected by the light sensor, leading to a rise in measurement error E, whereas at larger values of R, error E is reduced and measurement accuracy enhanced due to the enlarged field-of-view of the light sensor. By selecting an appropriate amount of taper (e.g., using no taper or other suitable amount of taper), device 10 may be configured to give accurate measurements of translucent material such as skin.

System 8 may gather and use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made to the described embodiments. The foregoing embodiments may be implemented individually or in any combination.

| Table of Reference Numerals | | | |
|---|---|---|---|
| 8 | system | 10 | electronic device |
| 12 | control circuitry | 22 | input-output devices |
| 16 | sensors | 24 | other devices |
| 40 | longitudinal axis | 44 | printed circuit |
| 42 | electrical components | 32 | exterior |
| 34 | interior | 30 | housing wall |
| 46 | light | 60 | tip portion |
| 58 | external object | 66 | internal structures |
| 62 | light source | 64 | light detector |
| 68, 72 | polarizers | 70, 74 | quarter wave plates |
| 68V, 68H | polarizers | 80 | optical components |
| 30D | tapered housing wall portions | 30V | untampered housing wall portions |
| FOV | field of view | EFOV | enhanced field of view |
| 70 | curve | 80 | optical component |

What is claimed is:
1. A portable electronic device, comprising:
an elongated housing having a tip portion;
a light sensor system at the tip portion, wherein the light sensor system includes:

a light source configured to emit light;

polarizer structures that overlap the light source and are configured to pass polarized light of a first type and polarized light of a second type based on the emitted light; and a light detector configured to measure first reflected light resulting from the polarized light of the first type being reflected from an external object and measure second reflected light resulting from the polarized light of the second type being reflected from the external object; and control circuitry that is configured to determine a degree of reflectivity of the external object based on a difference between the measured first reflected light and the measured second reflected light.

2. The portable electronic device defined in claim 1 wherein the polarizer structures include at least one linear polarizer.

3. The portable electronic device defined in claim 2 further comprising a wave plate that overlaps the linear polarizer.

4. The portable electronic device defined in claim 1 wherein the light source comprises at least first and second light-emitting devices.

5. The portable electronic device defined in claim 4 wherein the first light-emitting device comprises a first light-emitting diode and wherein the second light-emitting device comprises a second light-emitting diode.

6. The portable electronic device defined in claim 5 wherein the polarizer structures comprise:

a first linear polarizer that overlaps the first light-emitting diode and that is configured to linearly polarize emitted light from the first light-emitting diode along a first axis; and a second linear polarizer that overlaps the second light-emitting diode and that is configured to linearly polarize emitted light from the second light-emitting diode along a second axis that is orthogonal to the first axis.

7. The portable electronic device defined in claim 6 wherein the light detector is a color light detector.

8. The portable electronic device defined in claim 7 wherein the first and second light-emitting diodes comprise white light-emitting diodes.

9. The portable electronic device defined in claim 1 wherein the light source comprises a plurality of light-emitting devices each of which is configured to emit light of a different color.

10. The portable electronic device defined in claim 1 wherein the light detector is a color light detector.

11. The portable electronic device defined in claim 1 wherein the light sensor system further comprises quarter wave plates overlapping respectively the light source and the light detector.

12. The portable electronic device defined in claim 1 wherein the tip portion of the elongated housing has untapered housing walls.

13. The portable electronic device defined in claim 12 wherein the elongated housing has a cylindrical shape.

14. The portable electronic device defined in claim 1 wherein the light detector comprises a color light detector that is aligned with a longitudinal axis of the elongated housing and wherein the light source comprises a plurality of light-emitting diodes arranged in a ring around the color light detector.

15. The portable electronic device defined in claim 1 wherein the polarizer structures comprise an electrically rotatable polarizer.

16. The portable electronic device defined in claim 1, wherein the light detector is configured to measure the first reflected light at a first time and to measure the second reflected light at a second time.

17. An electronic device, comprising:

a housing;

a light sensor system in the housing that is configured to perform measurements on an external object, wherein the light sensor system comprises:

at least first and second sets of light-emitting devices;

a first set of polarizers covering the first set of light-emitting devices;

a second set of polarizers covering the second set of light-emitting devices, wherein the polarizers of the first and second sets of polarizers have orthogonal pass axes; and a light detector configured to detect light emitted from the first and second sets of light-emitting devices after the emitted light has interacted with the external object; and control circuitry configured to control the light sensor system to emit light of a first polarization at a first time and to emit light of a second polarization at a second time, and configured to discriminate between specular reflections from the external object and non-specular reflections from the external object based on a difference between a first signal from the light detector corresponding to the light of the first polarization and a second signal from the light detector corresponding to the light of the second polarization.

18. The electronic device defined in claim 17 wherein the light sensor system comprises quarter wave plates covering the first and second sets of polarizers and covering the light detector.

19. The electronic device defined in claim 17 wherein the housing has a pen shape.

20. The electronic device defined in claim 17 wherein the first and second sets of light-emitting devices are arranged in a ring around the light detector.

21. The electronic device defined in claim 17 wherein the housing has a cylindrical shape and the electronic device further comprises communications circuitry configured to convey information on the external object to external equipment.

22. A portable electronic device, comprising:

an elongated housing that extends along a longitudinal axis;

a color light detector aligned with the longitudinal axis;

a plurality of light-emitting diodes that are covered by polarizers and that are arranged in a ring around the color light detector; and control circuitry within the elongated housing and configured to:

gather a first measurement using the color light detector by illuminating an external object with first polarized light using the plurality of light-emitting diodes and the polarizers;

gather a second measurement using the color light detector by illuminating the external object with second polarized light using the plurality of light-emitting diodes and the polarizers; and compare the first and second measurements to determine a surface reflectivity of the external object.

23. The portable electronic device defined in claim 22 further comprising:
   wireless communications circuitry within the elongated housing and configured to convey information associated with the external object to external equipment.

* * * * *